US009450554B2

(12) United States Patent
Hsu et al.

(10) Patent No.: US 9,450,554 B2
(45) Date of Patent: Sep. 20, 2016

(54) ELECTRONIC DEVICE AND METHOD FOR ADJUSTING VOLUME

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Chih-Hua Hsu, New Taipei (TW); Sai-Rong Huang, Shenzhen (CN); Shi-Qiang Zhu, Shenzhen (CN); Xiao-Bo Feng, Shenzhen (CN); Zhi-Guo Li, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/674,067

(22) Filed: Mar. 31, 2015

(65) Prior Publication Data

US 2015/0280671 A1    Oct. 1, 2015

(30) Foreign Application Priority Data

Apr. 1, 2014    (CN) .......................... 2014 1 012 7913

(51) Int. Cl.
*H03G 3/00* (2006.01)
*H03G 3/30* (2006.01)

(52) U.S. Cl.
CPC .......... *H03G 3/3089* (2013.01); *H03G 3/3005* (2013.01)

(58) Field of Classification Search
None
See application file for complete search history.

(56) References Cited

U.S. PATENT DOCUMENTS

| 6,044,279 A * | 3/2000 | Hokao .................. G08B 1/08 455/567 |
| 6,329,964 B1 * | 12/2001 | Tanaka .................. A63F 13/02 345/8 |
| 2015/0035440 A1 * | 2/2015 | Spero .................. B60Q 1/04 315/153 |

FOREIGN PATENT DOCUMENTS

| CN | 101471983 B | 7/2009 |
| TW | 200949215 A1 | 12/2009 |

* cited by examiner

*Primary Examiner* — Muhammad N Edun
(74) *Attorney, Agent, or Firm* — Zhigang Ma (57) ABSTRACT

An electronic device and volume adjusting method detect ambient light and generate corresponding intensity signals via a sensor. Programs in a storage device, executed by at least one processor, cause the at least one processor to receive and sample light intensity signals and determine whether the ambient light level is changing. Time passing is counted if the ambient light level is changing, until the ambient light level stops changing. The counting of time stops when ambient light level stops changing and the counted time period is compared with a preset time period, a longer time period causes a volume adjusting command to be sent to a playback output device.

18 Claims, 5 Drawing Sheets

ELECTRONIC DEVICE AND METHOD FOR ADJUSTING VOLUME

CROSS-REFERENCE TO RELATED APPLICATIONS

This application claims priority to Chinese Patent Application No. 201410127913.X filed on Apr. 1, 2014, the contents of which are incorporated by reference herein.

FIELD

The subject matter herein generally relates to media data presentation.

BACKGROUND

Electronic devices with multimedia function can play audio. A user can adjust the volume of the audio through a "volume down" button or a "volume up" button.

BRIEF DESCRIPTION OF THE DRAWINGS

The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one."

The term "module" as used hereinafter, refers to logic embodied in hardware or firmware, or to a collection of software instructions, written in a programming language, such as, for example, Java, C, or assembly. One or more software instructions in the modules may be embedded in firmware. It will be appreciated that modules may comprise connected logic modules, such as gates and flip-flops, and may comprise programmable modules, such as programmable gate arrays or processors. The modules described herein may be implemented as either software and/or hardware modules and may be stored in any type of non-transitory computer-readable storage medium or other computer storage device. Some non-limiting examples of non-transitory computer-readable media include CDs, DVDs, BLU-RAY, flash memory, and hard disk drives. The term "comprising" means "including, but not necessarily limited to"; it specifically indicates open-ended inclusion or membership in a so-described combination, group, series and the like.

Figure 1:
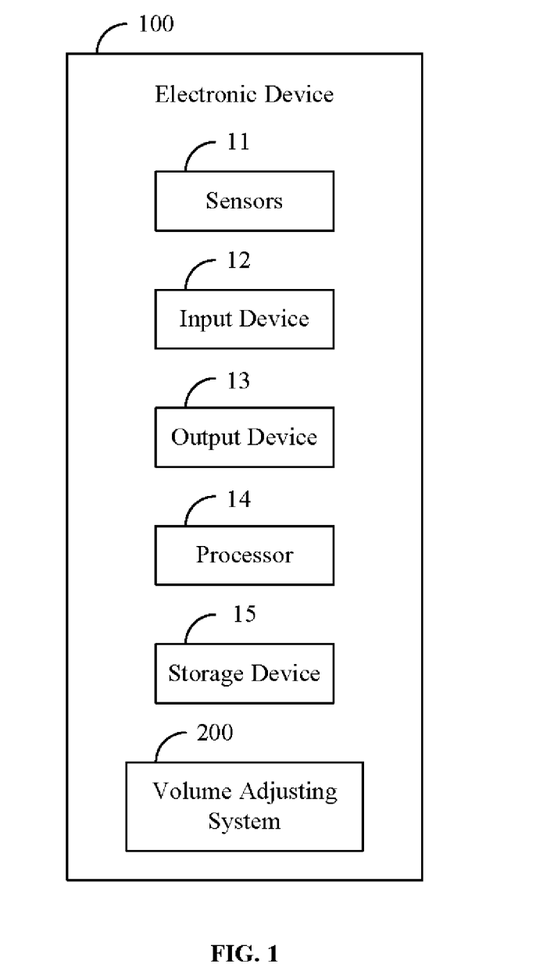
FIG. 1 is a block diagram of one embodiment of an electronic device including a volume adjusting system.

FIG. 1 illustrates a block diagram of an embodiment of an electronic device. In at least one embodiment, as shown in FIG. 1, an electronic device 100 includes, but is not limited to, a volume adjusting system 200, a number of sensors 11, an input device 12, an output device 13, at least one processor 14, and a storage device 15. The electronic device 100 can be a mobile phone or a tablet computer with audio play function. FIG. 1 illustrates only one example of an electronic device that can include more or fewer components than illustrated, or have a different configuration of the various components in other embodiments.

The volume adjusting system 200 can detect ambient light around the electronic device 100 and adjust volume of the electronic device 100 according to the changes of the ambient light levels.

In at least one embodiment, the storage device 15 can include various types of non-transitory computer-readable storage mediums. For example, the storage device 15 can be an internal storage system, such as a flash memory, a random access memory (RAM) for temporary storage of information, and/or a read-only memory (ROM) for permanent storage of information. The storage device 15 can also be an external storage system, such as a hard disk, a storage card, or a data storage medium. The at least one processor 14 can be a central processing module (CPU), a microprocessor, or other data processor chip that performs functions of the volume adjusting system 200 in the electronic device 100.

Figure 2:
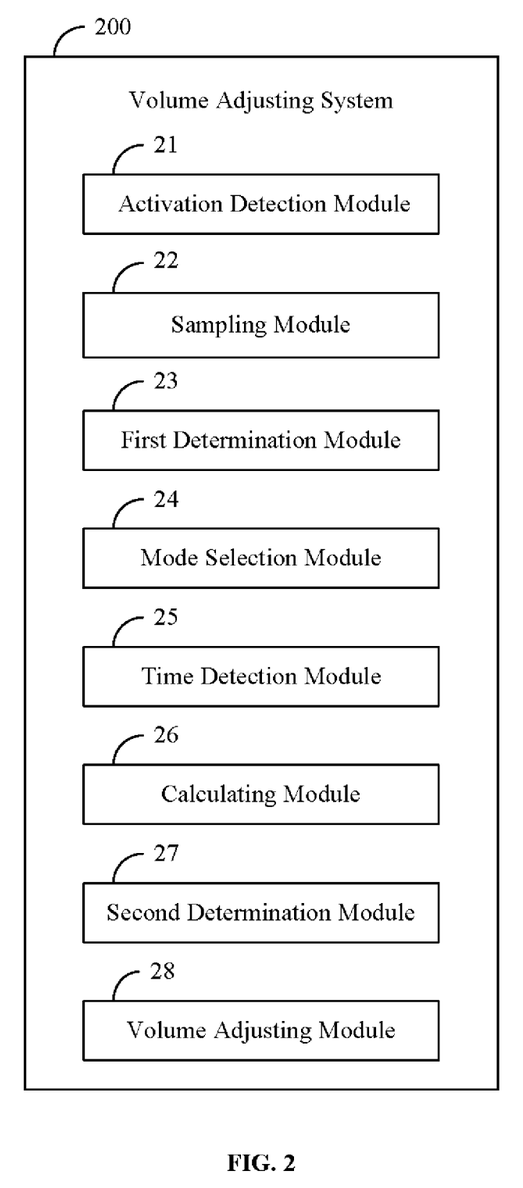
FIG. 2 is a block diagram of one embodiment of function modules of the volume adjusting system in the electronic device of FIG. 1.

FIG. 2 is a block diagram of one embodiment of function modules of the volume adjusting system. In at least one embodiment, the volume adjusting system 200 can include an activation detection module 21, a sampling module 22, a first determination module 23, a mode selection module 24, a time detection module 25, a calculating module 26, a second determination module 27 and a volume adjusting module 28. The function modules 21-28 can include computerized codes in the form of one or more programs, which are stored in the storage device 15. The at least one processor 14 executes the computerized codes to provide functions of the function modules 21-28.

The sensors 11 detect ambient light around the electronic device 100 and generate corresponding light intensity signals. In at least one embodiment, the sensors 11 include at least one light sensor and at least one IR (infrared ray) sensor. The light sensor detects ambient light when the level of ambient light is greater than a preset intensity, and the IR sensor detects ambient light when the level of ambient light is lower than the preset intensity.

The input device 12 detects a input signal input by a user and generates a corresponding input signal. In at least one embodiment, the input device 12 is a touch screen.

The storage device 15 also stores a number of applications. The applications include at least one audio processing program. The activation detection module 21 detects whether an audio processing program is activated. If an audio processing program is activated, the sensors 11 detect ambient light around the electronic device 100 and can generate corresponding intensity signals.

The sampling module 22 receives the intensity signals, samples the intensity signals according to a preset rule, and obtains a number of sampled signals. In at least one embodiment, each sampled signal includes an intensity value of the ambient light. The sampling module 22 samples the intensity signals according to a preset time interval.

The first determination module 23 determines whether the ambient light around the electronic device 100 has changed by comparing the intensity values of two adjacent sampled signals. In at least one embodiment, the first determination module 23 calculates a difference value between an intensity value of a sampled signal and an intensity value of a previous sampled signal, and determines whether the difference value is greater than a first preset value. If the difference value is equal to or lower than the first preset value, the ambient light is determined not to have changed. If the difference value is greater than the first preset value, the ambient light around the electronic device 100 is determined to have changed.

The electronic device 100 includes a number of modes for a user to select. In at least one embodiment, the modes include a time control mode and a change amount control mode. The mode selection module 24 determines whether the time control mode or another mode is selected if the ambient light around the electronic device 100 has changed.

If the user selects the time control mode, the time detecting module 25 starts to count time passing. Then the first determination module 23 determines whether any determined changing of the ambient light has stopped by comparing the intensity values of two adjacent sampled signals. In at least one embodiment, the first determination module 23 calculates a difference value between an intensity value of a sampled signal and an intensity value of a previous sampled signal, and determines whether the difference value is lower than a second preset value. If the difference value is equal to or lower than the second preset value, the changing of the ambient light level is determined to have stopped. If the difference value is greater than the second preset value, the changing of the ambient light is determined to not have stopped.

The time detecting module 25 stops counting the passing of time if the ambient light around the electronic device 100 stops changing, and the second determination module 27 then determines whether the counted passing of time is lower than a first preset time period. If the counted passing of time is lower than the first preset time period, the volume adjusting module 28 generates and sends a volume decreasing command to the output device 13. If the counted passing of time is not lower than the first preset time period, the second determination module 27 determines whether the counted passing of time is greater than a second preset time period. In at least one embodiment, the first preset time period is lower than the second preset time period. If the counted passing of time is greater than the second preset time period, the volume adjusting module 28 generates and sends a volume increasing command to the output device 13.

The output device 13 converts audio signals, processed or otherwise, outputted from the activated audio processing program and outputs the sound. The output device 13 decreases the volume of the sound in response to the volume decreasing command, and increases the volume of the sound in response to the volume increasing command.

If the change amount control mode is selected, the calculating module 25 starts receiving the sampled signals. Then the first determination module 23 determines whether any changing of the ambient light level has stopped by comparing the intensity values of two adjacent sampled signals. In at least one embodiment, the first determination module 23 calculates a difference value between an intensity value of a sampled signal and an intensity value of a previous sampled signal, and determines whether the difference value is lower than a second preset value. If the difference value is equal to or lower than the second preset value, the changing of the ambient light level is determined to have stopped. If the difference value is greater than the second preset value, the changing of the ambient light level is determined to be continuing.

The calculating module 25 stops receiving the sampled signals if the changing of the ambient light stops. Then the calculating module 25 calculates difference values between two intensity values of each two received sampled signals, and determines which difference value among calculated difference values is the greatest. The second determination module 27 determines whether the greatest difference value is lower than a first preset difference value. If the greatest difference value is lower than the first preset difference value, the volume adjusting module 28 generates and sends a volume decreasing command to the output device 13. If the greatest difference value is not lower than the first preset difference value, the second determination module 27 determines whether the greatest difference value is greater than a second preset difference value. In at least one embodiment, the first preset difference value is lower than the second preset difference value. If the greatest difference value is greater than the second preset difference value, the volume adjusting module 28 generates and sends a volume increasing command to the output device 13.

The output device 13 decreases the volume of the sound in response to the volume decreasing command, and increases the volume of the sound in response to the volume increasing command.

Figure 3:
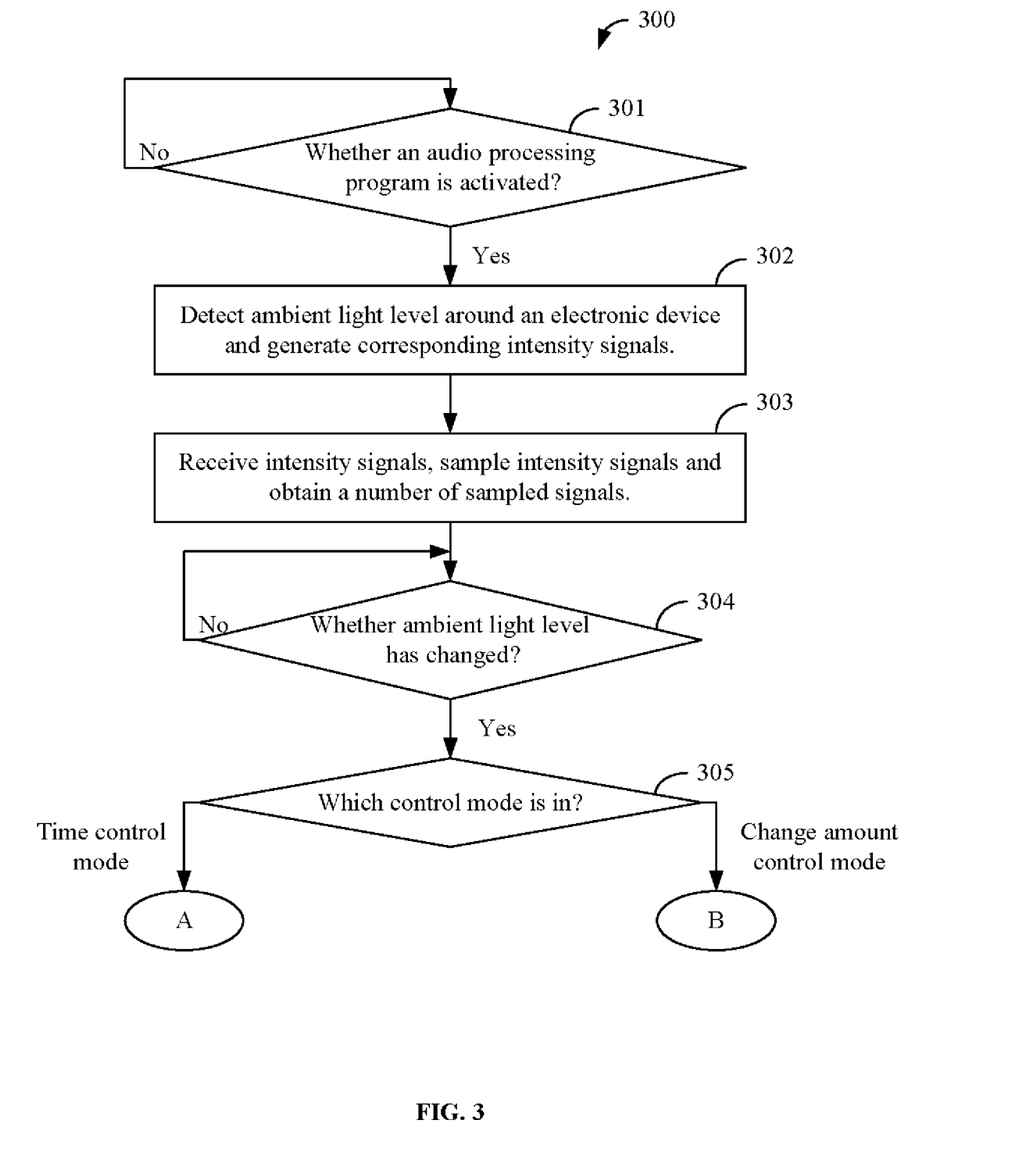
FIGS. 3-5 together constitute a flowchart of an embodiment of a method for adjusting volume of the electronic device of FIG. 1.
Figure 4:
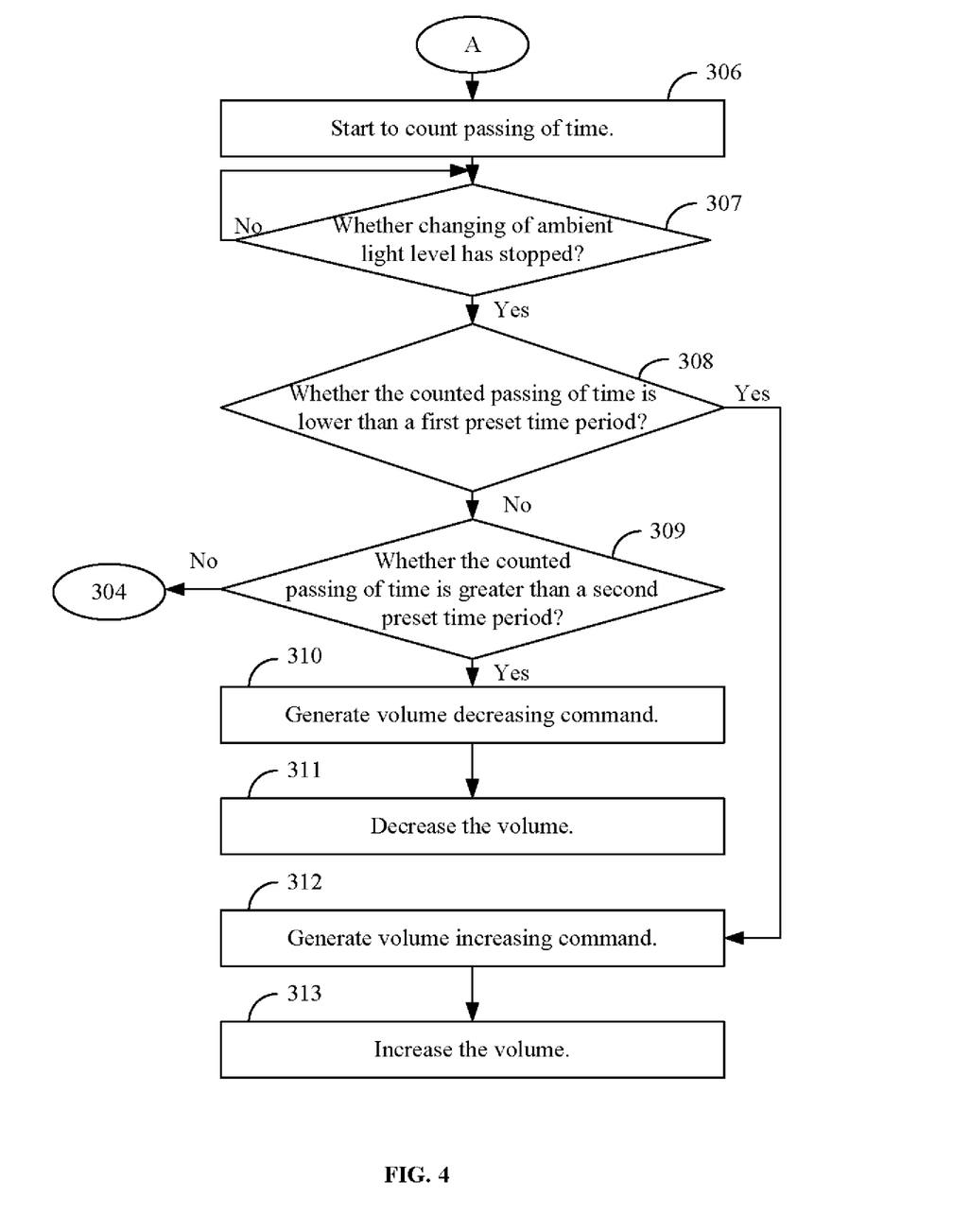
Figure 5:
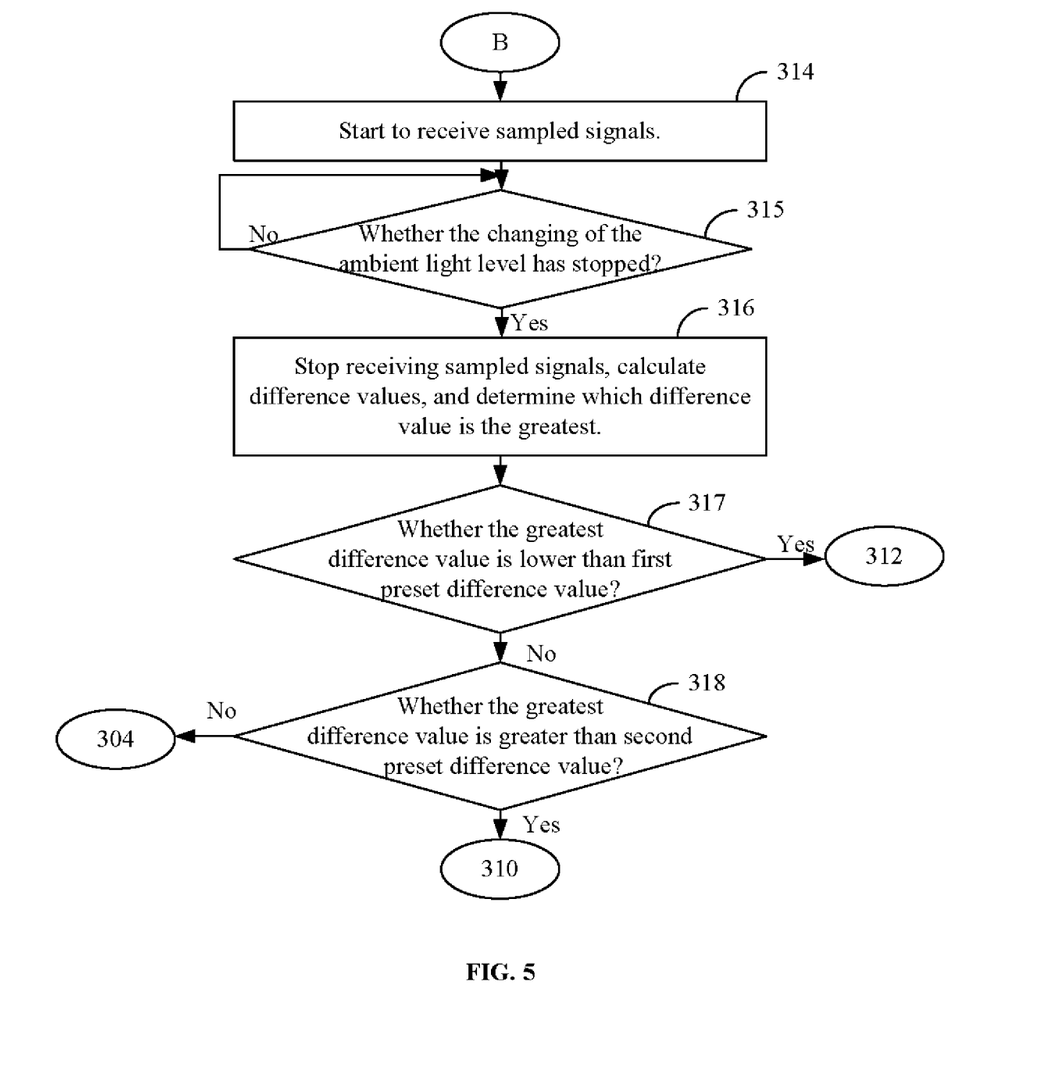

Referring to FIGS. 3-5, a flowchart is presented in accordance with an example embodiment. A method 300 is provided by way of example, as there are a variety of ways to carry out the method. The method 300 described below can be carried out using the configurations illustrated in FIG. 1 and various elements of these figures are referenced in explaining example method 300. Each block shown in FIGS. 3-5 represents one or more processes, methods, or routines, carried out in the exemplary method 300. Additionally, the illustrated order of blocks is by example only and the order of the blocks can be changed. The exemplary method 300 can begin at block 301.

At block 301, an activation detection module detects whether an audio processing program is activated. If an audio processing program is activated, block 302 is implemented. Until an audio processing program is activated, the process remains in 301.

At block 302, a number of sensors detect ambient light level around an electronic device and generate corresponding light intensity signals.

At block 303, a sampling module receives the intensity signals, samples the intensity signals based on a preset rule, and obtains a number of sampled signals each of which includes an intensity value of the ambient light. In at least one embodiment, the sampling module samples the intensity signals according to a preset time interval.

At block 304, a first determination module determines whether the ambient light level has changed by comparing the intensity values of two adjacent sampled signals. In at least one embodiment, the first determination module calculates a difference value between an intensity value of a sampled signal and an intensity value of a previous sampled signal, and determines whether the difference value is greater than a first preset value. If the difference value is equal to or lower than the first preset value, the first determination module determines that the level of the ambient light not have changed, and block 304 is implemented. If the difference value is greater than the first preset value, the first determination module determines that the level of the ambient light has changed, and block 305 is implemented.

At block 305, a mode selection module determines which control mode the electronic device is in. In at least one embodiment, the control mode of the electronic device can be switched between a time control mode and a change amount control mode. If the electronic device is in the time control mode, block 306 is implemented. If the electronic device is in the change amount control mode, block 314 is implemented.

At block 306, a time detecting module starts to count the passing of time.

At block 307, the first determination module determines whether the any changing of the ambient light level has stopped by comparing the intensity values of two adjacent sampled signals. In at least one embodiment, the first determination module calculates a difference value between an intensity value of a sampled signal and an intensity value of a previous sampled signal, and determines whether the difference value is lower than a second preset value. If the difference value is greater than the second preset value, the first determination module determines that the changing of the ambient light level is continuing, and the process goes back to block 307. If the difference value is equal to or lower than the second preset value, the first determination module determines that the changing of the ambient light level has stopped, the time detecting module stops counting the passing of time and block 308 is implemented.

At block 308, a second determination module determines whether the counted passing of time is lower than a first preset time period. If the counted passing of time is lower than the first preset time period, block 312 is implemented. If the counted passing of time is not lower than the first preset time period, block 309 is implemented.

At block 309, the second determination module determines whether the counted passing of time is greater than a second preset time period. In at least one embodiment, the first preset time period is lower than the second preset time period. If the counted passing of time is greater than the second preset time period, block 310 is implemented. If the counted passing of time is not greater than the second preset time period, the process goes back to block 304.

At block 310, a volume adjusting module generates and sends a volume decreasing command to an output device.

At block 311, the output device decreases the volume of the output sound in response to the volume decreasing command.

At block 312, the volume adjusting module generates and sends a volume increasing command to the output device.

At block 313, the output device increases the volume of the output sound in response to the volume increasing command.

At block 314, a calculating module starts to receive the sampled signals corresponding to the ambient light.

At block 315, the first determination module determines whether any changing of the ambient light level has stopped by comparing the intensity values of two adjacent sampled signals. In at least one embodiment, the first determination module calculates a difference value between an intensity value of a sampled signal and an intensity value of a previous sampled signal, and determines whether the difference value is lower than a second preset value. If the difference value is greater than the second preset value, the first determination module determines that the changing of the ambient light level has not stopped, and the process goes back to block 315. If the difference value is equal to or lower than the second preset value, the first determination module determines that the changing of the ambient light level has stopped, the calculating module stops receiving the sampled signals and block 316 is implemented.

At block 316, the calculating module calculates difference values between two intensity values of each two received sampled signals, and determines which difference value among calculated difference values is the greatest.

At block 317, the second determination module determines whether the greatest difference value is lower than a first preset difference value. If the greatest difference value is lower than the first preset difference value, block 312 is implemented. If the greatest difference value is not lower than the first preset difference value, block 318 is implemented.

At block 318, the second determination module determines whether the greatest difference value is greater than a second preset difference value. In at least one embodiment, the first preset difference value is lower than the second preset difference value. If the greatest difference value is greater than the second preset difference value, block 310 is implemented. If the greatest difference value is not greater than the second preset difference value, block 304 is implemented.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure, up to and including the full extent established by the broad general meaning of the terms used in the claims.

What is claimed is:

1. An electronic device comprising:
   at least one processor;
   at least one sensor configured to detect ambient light level and generate corresponding light intensity signals; and
   a non-transitory storage medium storing one or more programs, which when executed by the at least one processor, cause the at least one processor to:
   receive and sample the intensity signals generated by the at least one sensor and obtain sampled signals;
   determine whether the ambient light level has changed by comparing the intensity values of two adjacent sampled signals;
   start to count the passing of time if the ambient light level has changed;
   determine whether the changing of the ambient light level has stopped by comparing the intensity values of two adjacent subsequently sampled signals;
   stop counting the passing of time if the changing of the ambient light level has stopped;
   compare the counted passing of time with a preset time period and obtain a first compare result; and generate a first volume adjusting command according to the first compare result, and send the first volume adjusting command to an output device of the electronic device to control the output device to adjust volume.

2. The electronic device of claim 1, wherein the at least one processor further:
calculates difference value between an intensity value of a sampled signal and an intensity value of a previous sampled signal;
determines whether the difference value is greater than a first preset value; and
determines the ambient light level has changed if the difference value is greater than the first preset value.

3. The electronic device of claim 2, wherein the at least one processor further:
calculates difference value between an intensity value of a sampled signal and an intensity value of a previous sampled signal;
determines whether the difference value is lower than a second preset value; and
determines the changing of the ambient light level has stopped if the difference value is lower than the second preset value.

4. The electronic device of claim 1, wherein the at least one processor further:
determines whether the counted passing of time is lower than a first preset time period;
generates and sends a volume decreasing command to the output device if the counted passing of time is lower than the first preset time period;
determines whether the counted passing of time is greater than a second preset time period if the counted passing of time is not lower than the first preset time period, wherein the first preset time period is lower than the second preset time period; and
generates and sends a volume increasing command to the output device if the counted passing of time is greater than the second preset time period.

5. The electronic device of claim 1, wherein before "start to count the passing of time if the ambient light level has changed", the at least one processor further:
determines which control mode the electronic device is in;
starts to count the passing of time if the electronic device is in a time control mode;
starts to receive the sampled signals if the electronic device is in a change amount control mode;
determines whether the changing of the ambient light level has stopped by comparing the intensity values of two adjacent sampled signals;
stops receiving the sampled signals if the changing of the ambient light level has stopped;
calculates difference values between two intensity values of each two received sampled signals, and determines a greatest difference value among the calculated difference values;
compares the greatest difference value with a preset difference value, and obtains a second compare result; and
generates a second volume adjusting command according to the second compare result, and sends the second volume adjusting command to the output device to control the output device to adjust volume.

6. The electronic device of claim 5, wherein the at least one processor further:
determines whether the greatest difference value is lower than a first preset difference value;
generates and sends a volume decreasing command to the output device if the greatest difference value is lower than the first preset difference value;
determines whether the greatest difference value is greater than a second preset difference value if the greatest difference value is not lower than the first preset difference value, wherein the first preset difference value is lower than the second preset difference value;
generates and sends a volume increasing command to the output device if the greatest difference value is greater than the second preset difference value.

7. A computer-based method for adjusting volume for an electronic device being executed by at least one processor of the electronic device, the method comprising:
receiving and sampling intensity signals generated by the at least one sensor and obtaining sampled signals;
determining whether ambient light around the electronic device has changed by comparing the intensity values of two adjacent sampled signals;
starting to count the passing of time if the ambient light level has changed;
determining whether the changing of the ambient light level has stopped by comparing the intensity values of two adjacent sampled signals;
stopping counting the passing of time if the changing of the ambient light level has stopped;
comparing the counted passing of time with a preset time period and obtaining a first compare result; and
generating a first volume adjusting command according to the first compare result, and sending the first volume adjusting command to an output device of the electronic device to control the output device to adjust volume.

8. The method of claim 7, wherein the method comprising:
calculating difference value between an intensity value of a sampled signal and an intensity value of a previous sampled signal;
determining whether the difference value is greater than a first preset value; and
determining the ambient light level has changed if the difference value is greater than the first preset value.

9. The method of claim 8, wherein the method comprising:
calculating difference value between an intensity value of a sampled signal and an intensity value of a previous sampled signal;
determining whether the difference value is lower than a second preset value; and
determining the changing of the ambient light level has stopped if the difference value is lower than the second preset value.

10. The method of claim 7, wherein the method comprising:
determining whether the counted passing of time is lower than a first preset time period;
generating and sending a volume decreasing command to the output device if the counted passing of time is lower than the first preset time period;
determining whether the counted passing of time is greater than a second preset time period if the counted passing of time is not lower than the first preset time period, wherein the first preset time period is lower than the second preset time period;
generating and sending a volume increasing command to the output device if the counted passing of time is greater than the second preset time period.

11. The method of claim 7, wherein before "starting to count the passing of time if the ambient light level has changed", the method comprising:
- determining which control mode the electronic device is in;
- starting to count the passing of time detect the time period if the electronic device is in a time control mode;
- starting to receive the sampled signals if the electronic device is in a change amount control mode;
- determining whether the changing of the ambient light level has stopped by comparing the intensity values of two adjacent sampled signals;
- stopping receiving the sampled signals if the changing of the ambient light level has stopped;
- calculating difference values between two intensity values of each two received sampled signals, and determining a greatest difference value among the calculated difference values;
- comparing the greatest difference value with a preset difference value, and obtaining a second compare result; and
- generating a second volume adjusting command according to the second compare result, and sending the second volume adjusting command to the output device to control the output device to adjust volume.

12. The method of claim 11, wherein the method comprising:
- determining whether the greatest difference value is lower than a first preset difference value;
- generating and sending a volume decreasing command to the output device if the greatest difference value is lower than the first preset difference value;
- determining whether the greatest difference value is greater than a second preset difference value if the greatest difference value is not lower than the first preset difference value, wherein the first preset difference value is lower than the second preset difference value; and
- generating and sending a volume increasing command to the output device if the greatest difference value is greater than the second preset difference value.

13. A non-transitory storage medium having stored thereon instructions that, when executed by a processor of an electronic device, causes the processor to perform a volume adjusting method, wherein the method comprises:
- receiving and sampling intensity signals generated by the at least one sensor and obtaining sampled signals;
- determining whether ambient light around the electronic device has changed by comparing the intensity values of two adjacent sampled signals;
- starting to count the passing of time if the ambient light level has changed;
- determining whether the changing of the ambient light level has stopped by comparing the intensity values of two adjacent sampled signals;
- determining whether the changing of the ambient light level has stopped by comparing the intensity values of two adjacent sampled signals;
- comparing the counted passing of time with a preset time period and obtaining a first compare result; and
- generating a first volume adjusting command according to the first compare result, and sending the first volume adjusting command to an output device of the electronic device to control the output device to adjust volume.

14. The non-transitory storage medium according to claim 13, wherein the method comprises:
- calculating difference value between an intensity value of a sampled signal and an intensity value of a previous sampled signal;
- determining whether the difference value is greater than a first preset value; and
- determining the ambient light level has changed if the difference value is greater than the first preset value.

15. The non-transitory storage medium according to claim 14, wherein the method comprises:
- calculating difference value between an intensity value of a sampled signal and an intensity value of a previous sampled signal;
- determining whether the difference value is lower than a second preset value; and
- determining the changing of the ambient light level has stopped if the difference value is lower than the second preset value.

16. The non-transitory storage medium according to claim 13, wherein the method comprises:
- determining whether the counted passing of time is lower than a first preset time period;
- generating and sending a volume decreasing command to the output device if the counted passing of time is lower than the first preset time period;
- determining whether the counted passing of time is greater than a second preset time period if the counted passing of time is not lower than the first preset time period, wherein the first preset time period is lower than the second preset time period; and
- generating and sending a volume increasing command to the output device if the counted passing of time is greater than the second preset time period.

17. The non-transitory storage medium according to claim 13, wherein before "starting to count the passing of time if the ambient light level has changed", the method comprising:
- determining which control mode the electronic device is in;
- starting to count the passing of time detect the time period if the electronic device is in a time control mode;
- starting to receive the sampled signals if the electronic device is in a change amount control mode;
- determining whether the changing of the ambient light level has stopped by comparing the intensity values of two adjacent sampled signals;
- stopping receiving the sampled signals if the changing of the ambient light level has stopped;
- calculating difference values between two intensity values of each two received sampled signals, and determining a greatest difference value among the calculated difference values;
- comparing the greatest difference value with a preset difference value, and obtaining a second compare result; and
- generating a second volume adjusting command according to the second compare result, and sending the second volume adjusting command to the output device to control the output device to adjust volume.

18. The non-transitory storage medium according to claim 17, wherein the method comprises:
- determining whether the greatest difference value is lower than a first preset difference value;
- generating and sending a volume decreasing command to the output device if the greatest difference value is lower than the first preset difference value;
- determining whether the greatest difference value is greater than a second preset difference value if the greatest difference value is not lower than the first preset difference value, wherein the first preset difference value is lower than the second preset difference value; and generating and sending a volume increasing command to the output device if the greatest difference value is greater than the second preset difference value.

\* \* \* \* \*